(12) United States Patent
Gilbert

(10) Patent No.: US 8,222,822 B2
(45) Date of Patent: Jul. 17, 2012

(54) INDUCTIVELY-COUPLED PLASMA DEVICE

(75) Inventor: James A. Gilbert, Boulder, CO (US)

(73) Assignee: TYCO Healthcare Group LP, Mansfield, MA (US)

( * ) Notice: Subject to any disclaimer, the term of this patent is extended or adjusted under 35 U.S.C. 154(b) by 448 days.

(21) Appl. No.: 12/606,672

(22) Filed: Oct. 27, 2009

(65) Prior Publication Data

US 2011/0095689 A1 Apr. 28, 2011

(51) Int. Cl.
*H05H 1/46* (2006.01)
(52) U.S. Cl. ............ 315/111.51; 118/723 I; 156/345.48
(58) Field of Classification Search ............ 315/111.21, 315/111.41, 111.51; 156/345.48; 445/60, 445/72; 118/723 I; 313/231.31
See application file for complete search history.

(56) References Cited

U.S. PATENT DOCUMENTS

| | | | |
|---|---|---|---|
| 438,257 A | 10/1890 | Raquet |
| 2,213,820 A | 9/1940 | Maxson |
| 2,598,301 A | 5/1952 | Rajchman |
| 3,134,947 A | 5/1964 | Charasz |
| 3,838,242 A | 9/1974 | Goucher |
| 3,903,891 A | 9/1975 | Brayshaw |
| 3,938,525 A | 2/1976 | Coucher |
| 4,010,400 A | 3/1977 | Hollister |
| 4,017,707 A | 4/1977 | Brown et al. |
| 4,143,337 A | 3/1979 | Beaulieu |
| 4,177,422 A | 12/1979 | Deficis et al. |
| 4,181,897 A | 1/1980 | Miller |
| 4,188,426 A | 2/1980 | Auerbach |
| 4,274,919 A | 6/1981 | Jensen et al. |
| 4,337,415 A | 6/1982 | Durr |
| 4,577,165 A | 3/1986 | Uehara et al. |
| 4,629,887 A | 12/1986 | Bernier |
| 4,629,940 A | 12/1986 | Gagne et al. |
| 4,780,803 A | 10/1988 | Dede Garcia-Santamaria |
| 4,818,916 A | 4/1989 | Morrisroe |
| 4,877,999 A | 10/1989 | Knapp et al. |
| 4,901,719 A | 2/1990 | Trenconsky et al. |
| 4,922,210 A | 5/1990 | Flachenecker et al. |
| 4,956,582 A | 9/1990 | Bourassa |
| 5,025,373 A | 6/1991 | Keyser, Jr. et al. |
| 5,041,110 A | 8/1991 | Fleenor |
| 5,098,430 A | 3/1992 | Fleenor |
| 5,117,088 A | 5/1992 | Stava |

(Continued)

FOREIGN PATENT DOCUMENTS

DE  3710489  11/1987

(Continued)

OTHER PUBLICATIONS

U.S. Appl. No. 08/383,162, filed Feb. 3, 1995.

(Continued)

*Primary Examiner* — Douglas W Owens
*Assistant Examiner* — Amy Yang

(57) ABSTRACT

A plasma device configured to receive ionizable media is disclosed. The plasma device includes a first pair of dielectric substrates each having an inner surface and an outer surface. The first pair of dielectric substrates is disposed in spaced, parallel relation relative to one another with the inner surfaces thereof facing one another. The device also includes a first pair of spiral coils each disposed on the inner surface of the dielectric substrates. The first pair of spiral coils is configured to couple to a power source and configured to inductively couple to an ionizable media passed therebetween to ignite the ionizable media to form a plasma effluent.

20 Claims, 6 Drawing Sheets

U.S. PATENT DOCUMENTS

| | | | |
|---|---|---|---|
| 5,124,526 A | 6/1992 | Muller et al. | |
| 5,135,604 A | 8/1992 | Kumar et al. | |
| 5,155,547 A | 10/1992 | Casper et al. | |
| 5,159,173 A | 10/1992 | Frind et al. | |
| 5,180,949 A | 1/1993 | Durr | |
| 5,223,457 A | 6/1993 | Mintz et al. | |
| 5,256,138 A | 10/1993 | Burek et al. | |
| 5,280,154 A | 1/1994 | Cuomo et al. | |
| 5,300,068 A | 4/1994 | Rosar et al. | |
| 5,304,279 A | 4/1994 | Coultas et al. | |
| 5,320,621 A | 6/1994 | Gordon et al. | |
| 5,334,834 A | 8/1994 | Ito et al. | |
| RE34,780 E | 11/1994 | Trenconsky et al. | |
| 5,383,019 A | 1/1995 | Farrell et al. | |
| 5,384,167 A | 1/1995 | Nishiwaki et al. | |
| 5,401,350 A * | 3/1995 | Patrick et al. | 156/345.48 |
| 5,449,356 A | 9/1995 | Walbrink et al. | |
| 5,449,432 A | 9/1995 | Hanawa | |
| 5,505,729 A | 4/1996 | Rau | |
| 5,526,138 A | 6/1996 | Sato | |
| 5,531,834 A * | 7/1996 | Ishizuka et al. | 118/723 I |
| 5,534,231 A | 7/1996 | Savas | |
| 5,618,382 A | 4/1997 | Mintz et al. | |
| 5,683,366 A | 11/1997 | Eggers et al. | |
| 5,688,357 A | 11/1997 | Hanawa | |
| 5,697,882 A | 12/1997 | Eggers et al. | |
| 5,708,330 A | 1/1998 | Rothenbuhler et al. | |
| 5,720,745 A | 2/1998 | Farin et al. | |
| 5,733,511 A | 3/1998 | De Francesco | |
| 5,810,764 A | 9/1998 | Eggers et al. | |
| 5,818,581 A | 10/1998 | Kurosawa et al. | |
| 5,841,531 A | 11/1998 | Gliddon | |
| 5,843,019 A | 12/1998 | Eggers et al. | |
| 5,843,079 A | 12/1998 | Suslov | |
| 5,845,488 A | 12/1998 | Hancock et al. | |
| 5,849,136 A | 12/1998 | Mintz et al. | |
| 5,858,477 A | 1/1999 | Veerasamy et al. | |
| 5,865,937 A | 2/1999 | Shan et al. | |
| 5,866,985 A | 2/1999 | Coultas et al. | |
| 5,892,328 A | 4/1999 | Shang et al. | |
| 5,909,086 A | 6/1999 | Kim et al. | |
| 5,961,772 A | 10/1999 | Selwyn | |
| 5,977,715 A | 11/1999 | Li et al. | |
| 5,983,828 A * | 11/1999 | Savas | 118/723 I |
| 6,013,075 A | 1/2000 | Avramenko et al. | |
| 6,020,794 A | 2/2000 | Wilbur | |
| 6,024,733 A | 2/2000 | Eggers et al. | |
| 6,027,601 A | 2/2000 | Hanawa | |
| 6,030,667 A | 2/2000 | Nakagawa et al. | |
| 6,033,582 A | 3/2000 | Lee et al. | |
| 6,036,878 A | 3/2000 | Collins | |
| 6,046,546 A | 4/2000 | Porter et al. | |
| 6,047,700 A | 4/2000 | Eggers et al. | |
| 6,053,172 A | 4/2000 | Hovda et al. | |
| 6,063,079 A | 5/2000 | Hovda et al. | |
| 6,063,084 A | 5/2000 | Farin | |
| 6,063,937 A | 5/2000 | Dlubala et al. | |
| 6,066,134 A | 5/2000 | Eggers et al. | |
| 6,086,585 A | 6/2000 | Hovda et al. | |
| 6,099,523 A | 8/2000 | Kim et al. | |
| 6,102,046 A | 8/2000 | Weinstein et al. | |
| 6,105,581 A | 8/2000 | Eggers et al. | |
| 6,109,268 A | 8/2000 | Thapliyal et al. | |
| 6,110,395 A | 8/2000 | Gibson, Jr. | |
| 6,113,597 A | 9/2000 | Eggers et al. | |
| 6,132,575 A | 10/2000 | Pandumsoporn et al. | |
| 6,137,237 A | 10/2000 | MacLennan et al. | |
| 6,142,992 A | 11/2000 | Cheng et al. | |
| 6,149,620 A | 11/2000 | Baker et al. | |
| 6,153,852 A | 11/2000 | Blutke et al. | |
| 6,159,208 A | 12/2000 | Hovda et al. | |
| 6,170,428 B1 | 1/2001 | Redeker et al. | |
| 6,178,918 B1 | 1/2001 | Van Os et al. | |
| 6,179,836 B1 | 1/2001 | Eggers et al. | |
| 6,182,469 B1 | 2/2001 | Campbell et al. | |
| 6,183,469 B1 | 2/2001 | Thapliyal et al. | |
| 6,183,655 B1 | 2/2001 | Wang et al. | |
| 6,190,381 B1 | 2/2001 | Olsen et al. | |
| 6,197,026 B1 | 3/2001 | Farin et al. | |
| 6,203,542 B1 | 3/2001 | Ellsberry et al. | |
| 6,206,871 B1 | 3/2001 | Zanon et al. | |
| 6,207,924 B1 | 3/2001 | Trassy | |
| 6,210,402 B1 | 4/2001 | Olsen et al. | |
| 6,210,410 B1 | 4/2001 | Farin et al. | |
| 6,213,999 B1 | 4/2001 | Platt, Jr. et al. | |
| 6,222,186 B1 | 4/2001 | Li et al. | |
| 6,224,592 B1 | 5/2001 | Eggers et al. | |
| 6,225,593 B1 | 5/2001 | Howieson et al. | |
| 6,225,693 B1 | 5/2001 | Miyawaki | |
| 6,228,078 B1 | 5/2001 | Eggers et al. | |
| 6,228,082 B1 | 5/2001 | Baker et al. | |
| 6,228,229 B1 | 5/2001 | Raaijmakers et al. | |
| 6,235,020 B1 | 5/2001 | Cheng et al. | |
| 6,237,526 B1 | 5/2001 | Brcka | |
| 6,238,391 B1 | 5/2001 | Olsen et al. | |
| 6,242,735 B1 | 6/2001 | Li et al. | |
| 6,248,250 B1 | 6/2001 | Hanawa et al. | |
| 6,252,354 B1 | 6/2001 | Collins et al. | |
| 6,254,600 B1 | 7/2001 | Willink et al. | |
| 6,254,738 B1 | 7/2001 | Stimson et al. | |
| 6,264,650 B1 | 7/2001 | Hovda et al. | |
| 6,264,651 B1 | 7/2001 | Underwood et al. | |
| 6,264,652 B1 | 7/2001 | Eggers et al. | |
| 6,270,687 B1 | 8/2001 | Ye et al. | |
| 6,277,112 B1 | 8/2001 | Underwood et al. | |
| 6,277,251 B1 | 8/2001 | Hwang et al. | |
| 6,283,961 B1 | 9/2001 | Underwood et al. | |
| 6,287,980 B1 | 9/2001 | Hanazaki et al. | |
| 6,291,938 B1 | 9/2001 | Jewett et al. | |
| 6,296,636 B1 | 10/2001 | Cheng et al. | |
| 6,296,638 B1 | 10/2001 | Davison et al. | |
| 6,299,948 B1 | 10/2001 | Gherardi et al. | |
| 6,309,387 B1 | 10/2001 | Eggers et al. | |
| 6,313,587 B1 | 11/2001 | MacLennan et al. | |
| 6,326,584 B1 | 12/2001 | Jewett et al. | |
| 6,326,739 B1 | 12/2001 | MacLennan et al. | |
| 6,328,760 B1 | 12/2001 | James | |
| 6,329,757 B1 | 12/2001 | Morrisroe et al. | |
| 6,333,481 B2 | 12/2001 | Augeraud et al. | |
| 6,345,588 B1 | 2/2002 | Stimson | |
| 6,346,108 B1 | 2/2002 | Fischer | |
| 6,348,051 B1 | 2/2002 | Farin et al. | |
| 6,353,206 B1 | 3/2002 | Roderick | |
| 6,355,032 B1 | 3/2002 | Hovda et al. | |
| 6,363,937 B1 | 4/2002 | Hovda et al. | |
| 6,365,063 B2 | 4/2002 | Collins et al. | |
| 6,375,750 B1 | 4/2002 | Van Os et al. | |
| 6,379,351 B1 | 4/2002 | Thapliyal et al. | |
| 6,387,088 B1 | 5/2002 | Shattuck et al. | |
| 6,391,025 B1 | 5/2002 | Weinstein et al. | |
| 6,396,214 B1 | 5/2002 | Grosse et al. | |
| 6,401,652 B1 | 6/2002 | Mohn et al. | |
| 6,409,933 B1 | 6/2002 | Holland et al. | |
| RE37,780 E | 7/2002 | Lanzani et al. | |
| 6,416,507 B1 | 7/2002 | Eggers et al. | |
| 6,416,508 B1 | 7/2002 | Eggers et al. | |
| 6,416,633 B1 | 7/2002 | Spence | |
| 6,424,099 B1 | 7/2002 | Kirkpatrick et al. | |
| 6,424,232 B1 | 7/2002 | Mavretic et al. | |
| 6,432,103 B1 | 8/2002 | Ellsberry et al. | |
| 6,432,260 B1 | 8/2002 | Mahoney et al. | |
| 6,443,948 B1 | 9/2002 | Suslov | |
| 6,444,084 B1 | 9/2002 | Collins | |
| 6,445,141 B1 | 9/2002 | Kastner et al. | |
| 6,459,066 B1 | 10/2002 | Khater et al. | |
| 6,461,350 B1 | 10/2002 | Underwood et al. | |
| 6,461,354 B1 | 10/2002 | Olsen et al. | |
| 6,462,483 B1 * | 10/2002 | Jeng et al. | 315/111.51 |
| 6,464,695 B2 | 10/2002 | Hovda et al. | |
| 6,464,889 B1 | 10/2002 | Lee et al. | |
| 6,464,891 B1 | 10/2002 | Druz et al. | |
| 6,468,270 B1 | 10/2002 | Hovda et al. | |
| 6,468,274 B1 | 10/2002 | Alleyne et al. | |
| 6,471,822 B1 | 10/2002 | Yin et al. | |
| 6,474,258 B2 | 11/2002 | Brcka | |
| 6,482,201 B1 | 11/2002 | Olsen et al. | |
| 6,497,826 B2 | 12/2002 | Li et al. | |

| Patent | Kind | Date | Inventor |
|---|---|---|---|
| 6,500,173 | B2 | 12/2002 | Underwood et al. |
| 6,502,416 | B2 | 1/2003 | Kawasumi et al. |
| 6,502,588 | B2 | 1/2003 | Li et al. |
| 6,507,155 | B1 | 1/2003 | Barnes et al. |
| 6,525,481 | B1 | 2/2003 | Klima et al. |
| 6,540,741 | B1 | 4/2003 | Underwood et al. |
| 6,544,261 | B2 | 4/2003 | Ellsberry et al. |
| 6,572,732 | B2 * | 6/2003 | Collins .................... 156/345.48 |
| 6,575,968 | B1 | 6/2003 | Eggers et al. |
| 6,579,289 | B2 | 6/2003 | Schnitzler |
| 6,579,426 | B1 | 6/2003 | Van Gogh et al. |
| 6,582,423 | B1 | 6/2003 | Thapliyal et al. |
| 6,582,427 | B1 | 6/2003 | Goble et al. |
| 6,582,429 | B2 | 6/2003 | Krishnan et al. |
| 6,589,237 | B2 | 7/2003 | Woloszko et al. |
| 6,589,437 | B1 | 7/2003 | Collins |
| 6,595,990 | B1 | 7/2003 | Weinstein et al. |
| 6,617,794 | B2 | 9/2003 | Barnes et al. |
| 6,624,583 | B1 | 9/2003 | Coll et al. |
| 6,625,555 | B2 | 9/2003 | Kuan et al. |
| 6,629,974 | B2 | 10/2003 | Penny et al. |
| 6,632,193 | B1 | 10/2003 | Davison et al. |
| 6,632,220 | B1 | 10/2003 | Eggers et al. |
| 6,642,526 | B2 | 11/2003 | Hartley |
| 6,646,386 | B1 | 11/2003 | Sirkis et al. |
| 6,652,717 | B1 | 11/2003 | Hong |
| 6,653,594 | B2 | 11/2003 | Nakamura et al. |
| 6,657,594 | B2 | 12/2003 | Anderson |
| 6,659,106 | B1 | 12/2003 | Hovda et al. |
| 6,663,017 | B2 | 12/2003 | Endres et al. |
| 6,685,803 | B2 | 2/2004 | Lazarovich et al. |
| 6,693,253 | B2 * | 2/2004 | Boulos et al. ............ 219/121.52 |
| 6,712,811 | B2 | 3/2004 | Underwood et al. |
| 6,719,754 | B2 | 4/2004 | Underwood et al. |
| 6,719,883 | B2 | 4/2004 | Stimson |
| 6,723,091 | B2 | 4/2004 | Goble et al. |
| 6,726,684 | B1 | 4/2004 | Woloszko et al. |
| 6,740,842 | B2 | 5/2004 | Johnson et al. |
| 6,746,447 | B2 | 6/2004 | Davison et al. |
| 6,763,836 | B2 | 7/2004 | Tasto et al. |
| 6,770,071 | B2 | 8/2004 | Woloszko et al. |
| 6,772,012 | B2 | 8/2004 | Woloszko et al. |
| 6,773,431 | B2 | 8/2004 | Eggers et al. |
| 6,774,569 | B2 | 8/2004 | De Vries et al. |
| 6,780,178 | B2 | 8/2004 | Palanker et al. |
| 6,780,184 | B2 | 8/2004 | Tanrisever |
| 6,781,317 | B1 | 8/2004 | Goodman |
| 6,787,730 | B2 | 9/2004 | Coccio et al. |
| 6,805,130 | B2 | 10/2004 | Tasto et al. |
| 6,806,438 | B2 | 10/2004 | Nakano et al. |
| 6,815,633 | B1 | 11/2004 | Chen et al. |
| 6,818,140 | B2 | 11/2004 | Ding |
| 6,832,996 | B2 | 12/2004 | Woloszko et al. |
| 6,837,884 | B2 | 1/2005 | Woloszko |
| 6,837,887 | B2 | 1/2005 | Woloszko et al. |
| 6,837,888 | B2 | 1/2005 | Ciarrocca et al. |
| 6,840,937 | B2 | 1/2005 | Van Wyk |
| 6,849,191 | B2 | 2/2005 | Ono et al. |
| 6,855,143 | B2 | 2/2005 | Davison et al. |
| 6,855,225 | B1 | 2/2005 | Su et al. |
| 6,867,859 | B1 | 3/2005 | Powell |
| 6,876,155 | B2 | 4/2005 | Howald et al. |
| 6,890,332 | B2 | 5/2005 | Truckai et al. |
| 6,896,672 | B1 | 5/2005 | Eggers et al. |
| 6,896,674 | B1 | 5/2005 | Woloszko et al. |
| 6,896,775 | B2 | 5/2005 | Chistyakov |
| 6,909,237 | B1 | 6/2005 | Park et al. |
| 6,915,806 | B2 | 7/2005 | Pacek et al. |
| 6,919,527 | B2 | 7/2005 | Boulos et al. |
| 6,920,883 | B2 | 7/2005 | Bessette et al. |
| 6,921,398 | B2 | 7/2005 | Carmel et al. |
| 6,922,093 | B2 | 7/2005 | Kanda |
| 6,924,455 | B1 | 8/2005 | Chen et al. |
| 6,929,640 | B1 | 8/2005 | Underwood et al. |
| 6,949,096 | B2 | 9/2005 | Davison et al. |
| 6,949,887 | B2 | 9/2005 | Kirkpatrick et al. |
| 6,958,063 | B1 | 10/2005 | Soll et al. |
| 6,974,453 | B2 | 12/2005 | Woloszko et al. |
| 6,991,631 | B2 | 1/2006 | Woloszko et al. |
| 7,004,941 | B2 | 2/2006 | Tvinnereim et al. |
| 7,019,253 | B2 | 3/2006 | Johnson et al. |
| 7,046,088 | B2 | 5/2006 | Ziegler |
| 7,048,733 | B2 | 5/2006 | Hartley et al. |
| 7,070,596 | B1 | 7/2006 | Woloszko et al. |
| 7,084,832 | B2 | 8/2006 | Pribyl |
| 7,090,672 | B2 | 8/2006 | Underwood et al. |
| 7,096,819 | B2 | 8/2006 | Chen et al. |
| 7,100,532 | B2 | 9/2006 | Pribyl |
| 7,104,986 | B2 | 9/2006 | Hovda et al. |
| 7,115,185 | B1 | 10/2006 | Gonzalez et al. |
| 7,122,035 | B2 | 10/2006 | Canady |
| 7,122,965 | B2 | 10/2006 | Goodman |
| 7,131,969 | B1 | 11/2006 | Hovda et al. |
| 7,132,620 | B2 | 11/2006 | Coelho et al. |
| 7,132,996 | B2 | 11/2006 | Evans et al. |
| 7,150,745 | B2 | 12/2006 | Stern et al. |
| 7,157,857 | B2 | 1/2007 | Brouk et al. |
| 7,160,521 | B2 | 1/2007 | Porshnev et al. |
| 7,161,112 | B2 | 1/2007 | Smith et al. |
| 7,164,484 | B2 | 1/2007 | Takahashi et al. |
| 7,166,816 | B1 | 1/2007 | Chen et al. |
| 7,179,255 | B2 | 2/2007 | Lettice et al. |
| 7,186,234 | B2 | 3/2007 | Dahla et al. |
| 7,189,939 | B2 | 3/2007 | Lee et al. |
| 7,189,940 | B2 | 3/2007 | Kumar et al. |
| 7,192,428 | B2 | 3/2007 | Eggers et al. |
| 7,199,399 | B2 | 4/2007 | Chin-Lung et al. |
| 7,201,750 | B1 | 4/2007 | Eggers et al. |
| 7,214,280 | B2 | 5/2007 | Kumar et al. |
| 7,214,934 | B2 | 5/2007 | Stevenson |
| 7,217,268 | B2 | 5/2007 | Eggers et al. |
| 7,217,903 | B2 | 5/2007 | Bayer et al. |
| 7,220,261 | B2 | 5/2007 | Truckai et al. |
| 7,227,097 | B2 | 6/2007 | Kumar et al. |
| 7,238,185 | B2 | 7/2007 | Palanker et al. |
| 7,241,293 | B2 | 7/2007 | Davison |
| 7,270,658 | B2 | 9/2007 | Woloszko et al. |
| 7,270,659 | B2 | 9/2007 | Ricart et al. |
| 7,270,661 | B2 | 9/2007 | Dahla et al. |
| 7,271,363 | B2 | 9/2007 | Lee et al. |
| 7,275,344 | B2 | 10/2007 | Woodmansee, III et al. |
| 7,276,063 | B2 | 10/2007 | Davison et al. |
| 7,282,244 | B2 | 10/2007 | Schaepkens et al. |
| 7,292,191 | B2 | 11/2007 | Anderson |
| 7,297,143 | B2 | 11/2007 | Woloszko et al. |
| 7,297,145 | B2 | 11/2007 | Woloszko et al. |
| 7,298,091 | B2 | 11/2007 | Pickard et al. |
| 7,309,843 | B2 | 12/2007 | Kumar et al. |
| 7,316,682 | B2 | 1/2008 | Konesky |
| 7,318,823 | B2 | 1/2008 | Sharps et al. |
| 7,331,957 | B2 | 2/2008 | Woloszko et al. |
| 7,353,771 | B2 | 4/2008 | Millner et al. |
| 7,355,379 | B2 | 4/2008 | Kitamura et al. |
| 7,357,798 | B2 | 4/2008 | Sharps et al. |
| 7,361,175 | B2 | 4/2008 | Suslov |
| 7,387,625 | B2 | 6/2008 | Hovda et al. |
| 7,393,351 | B2 | 7/2008 | Woloszko et al. |
| 7,399,944 | B2 | 7/2008 | DeVries et al. |
| 7,410,669 | B2 | 8/2008 | Dieckhoff et al. |
| 7,419,488 | B2 | 9/2008 | Ciarrocca et al. |
| 7,426,900 | B2 | 9/2008 | Brcka |
| 7,429,260 | B2 | 9/2008 | Underwood et al. |
| 7,429,262 | B2 | 9/2008 | Woloszko et al. |
| 7,431,857 | B2 | 10/2008 | Shannon et al. |
| 7,435,247 | B2 | 10/2008 | Woloszko et al. |
| 7,442,191 | B2 | 10/2008 | Hovda et al. |
| 7,449,021 | B2 | 11/2008 | Underwood et al. |
| 7,453,403 | B2 | 11/2008 | Anderson |
| 7,459,899 | B2 | 12/2008 | Mattaboni et al. |
| 7,468,059 | B2 | 12/2008 | Eggers et al. |
| 7,480,299 | B2 | 1/2009 | O'Keeffe et al. |
| 7,489,206 | B2 | 2/2009 | Kotani et al. |
| 7,491,200 | B2 | 2/2009 | Underwood |
| 7,498,000 | B2 | 3/2009 | Pekshev et al. |
| 7,506,014 | B2 | 3/2009 | Drummond |
| 7,507,236 | B2 | 3/2009 | Eggers et al. |
| 7,510,665 | B2 | 3/2009 | Shannon et al. |
| 7,511,246 | B2 | 3/2009 | Morrisroe |

| | | |
|---|---|---|
| 7,563,261 B2 | 7/2009 | Carmel et al. |
| 7,566,333 B2 | 7/2009 | Van Wyk et al. |
| 7,589,473 B2 | 9/2009 | Suslov |
| 7,611,509 B2 | 11/2009 | Van Wyk |
| 7,632,267 B2 | 12/2009 | Dahla |
| 7,633,231 B2 | 12/2009 | Watson |
| 7,666,478 B2 | 2/2010 | Paulussen et al. |
| 7,691,101 B2 | 4/2010 | Davison et al. |
| 7,708,733 B2 | 5/2010 | Sanders et al. |
| 7,715,889 B2 | 5/2010 | Ito |
| 7,758,575 B2 | 7/2010 | Beller |
| 7,824,398 B2 | 11/2010 | Woloszko et al. |
| 7,879,034 B2 | 2/2011 | Woloszko et al. |
| 7,887,891 B2 | 2/2011 | Rius |
| 7,892,223 B2 | 2/2011 | Geiselhart |
| 7,892,230 B2 | 2/2011 | Woloszko |
| 7,901,403 B2 | 3/2011 | Woloszko et al. |
| 7,940,008 B2 | 5/2011 | Mattaboni et al. |
| 7,949,407 B2 | 5/2011 | Kaplan et al. |
| 2001/0029373 A1 | 10/2001 | Baker et al. |
| 2001/0054601 A1 | 12/2001 | Ding |
| 2002/0022836 A1 | 2/2002 | Goble et al. |
| 2002/0023899 A1 | 2/2002 | Khater et al. |
| 2002/0092826 A1 | 7/2002 | Ding |
| 2002/0125207 A1 | 9/2002 | Ono et al. |
| 2002/0132380 A1 | 9/2002 | Nakano et al. |
| 2003/0006019 A1 | 1/2003 | Johnson et al. |
| 2003/0075522 A1 | 4/2003 | Weichart et al. |
| 2003/0084613 A1 | 5/2003 | Futamura et al. |
| 2003/0088245 A1 | 5/2003 | Woloszko et al. |
| 2003/0132198 A1 | 7/2003 | Ono et al. |
| 2003/0158545 A1 | 8/2003 | Hovda et al. |
| 2003/0171743 A1 | 9/2003 | Tasto et al. |
| 2003/0208196 A1 | 11/2003 | Stone |
| 2003/0212396 A1 | 11/2003 | Eggers et al. |
| 2004/0007985 A1 | 1/2004 | De Vries et al. |
| 2004/0086434 A1 | 5/2004 | Gadgil et al. |
| 2004/0112518 A1 | 6/2004 | Rossier et al. |
| 2004/0116922 A1 | 6/2004 | Hovda et al. |
| 2004/0127893 A1 | 7/2004 | Hovda |
| 2004/0129212 A1 | 7/2004 | Gadgil et al. |
| 2004/0230190 A1 | 11/2004 | Dahla et al. |
| 2005/0017646 A1 | 1/2005 | Boulos et al. |
| 2005/0075630 A1 | 4/2005 | Truckai et al. |
| 2005/0103748 A1 | 5/2005 | Yamaguchi et al. |
| 2005/0205212 A1 | 9/2005 | Singh et al. |
| 2006/0011465 A1 | 1/2006 | Burke et al. |
| 2006/0017388 A1 | 1/2006 | Stevenson |
| 2006/0021580 A1 | 2/2006 | Hirano |
| 2006/0036237 A1 | 2/2006 | Davison et al. |
| 2006/0038992 A1 | 2/2006 | Morrisroe |
| 2006/0065628 A1 | 3/2006 | Vahedi et al. |
| 2006/0084158 A1 | 4/2006 | Viol |
| 2006/0095031 A1 | 5/2006 | Ormsby |
| 2006/0175015 A1 | 8/2006 | Chen et al. |
| 2006/0189971 A1 | 8/2006 | Tasto et al. |
| 2006/0189976 A1 | 8/2006 | Karni et al. |
| 2006/0259025 A1 | 11/2006 | Dahla |
| 2006/0266735 A1 | 11/2006 | Shannon et al. |
| 2006/0278254 A1 | 12/2006 | Jackson |
| 2007/0021747 A1 | 1/2007 | Suslov |
| 2007/0021748 A1 | 1/2007 | Suslov |
| 2007/0029292 A1 | 2/2007 | Suslov |
| 2007/0084563 A1 | 4/2007 | Holland |
| 2007/0087455 A1 | 4/2007 | Hoffman |
| 2007/0093804 A1 | 4/2007 | Kaveckis et al. |
| 2007/0093805 A1 | 4/2007 | Auth et al. |
| 2007/0106288 A1 | 5/2007 | Woloszko et al. |
| 2007/0149966 A1 | 6/2007 | Dahla et al. |
| 2007/0149970 A1 | 6/2007 | Schnitzler et al. |
| 2007/0161981 A1 | 7/2007 | Sanders et al. |
| 2007/0213704 A1 | 9/2007 | Truckai et al. |
| 2007/0251920 A1 | 11/2007 | Hoffman |
| 2007/0258329 A1 | 11/2007 | Winey |
| 2007/0291804 A1 | 11/2007 | Suslov |
| 2007/0290620 A1 | 12/2007 | Lee et al. |
| 2008/0023443 A1 | 1/2008 | Paterson et al. |
| 2008/0039832 A1 | 2/2008 | Palanker et al. |
| 2008/0083701 A1 | 4/2008 | Shao et al. |

| | | |
|---|---|---|
| 2008/0089895 A1 | 4/2008 | Utku et al. |
| 2008/0099434 A1 | 5/2008 | Chandrachood et al. |
| 2008/0099435 A1 | 5/2008 | Grimbergen |
| 2008/0099436 A1 | 5/2008 | Grimbergen |
| 2008/0108985 A1 | 5/2008 | Konesky |
| 2008/0122252 A1 | 5/2008 | Corke et al. |
| 2008/0138374 A1 | 6/2008 | Storey et al. |
| 2008/0167398 A1 | 7/2008 | Patil et al. |
| 2008/0179290 A1 | 7/2008 | Collins et al. |
| 2008/0185366 A1 | 8/2008 | Suslov |
| 2008/0268172 A1 | 10/2008 | Fukuda et al. |
| 2008/0284506 A1 | 11/2008 | Messer |
| 2008/0292497 A1 | 11/2008 | Vangeneugden et al. |
| 2009/0039789 A1 | 2/2009 | Nikolay |
| 2009/0054896 A1 | 2/2009 | Fridman et al. |
| 2009/0064933 A1 | 3/2009 | Liu et al. |
| 2010/0089742 A1 | 4/2010 | Suslov |
| 2010/0130973 A1 | 5/2010 | Choi et al. |
| 2011/0094997 A1* | 4/2011 | Yamazawa et al. ............. 216/68 |

FOREIGN PATENT DOCUMENTS

| | | |
|---|---|---|
| DE | 4139029 | 6/1993 |
| DE | 4326037 | 2/1995 |
| DE | 9117019 | 4/1995 |
| DE | 19537897 | 3/1997 |
| DE | 9117299 | 4/2000 |
| DE | 19848784 | 5/2000 |
| DE | 29724247 | 8/2000 |
| DE | 19524645 | 11/2002 |
| EP | 0016542 B1 | 10/1980 |
| EP | 0495699 B1 | 7/1992 |
| EP | 0602764 A1 | 6/1994 |
| EP | 0956827 | 11/1999 |
| EP | 1174901 A2 | 1/2002 |
| FR | 1340509 | 9/1963 |
| JP | 61-159953 | 7/1986 |
| SU | 1438745 | 11/1988 |
| WO | WO 99/01887 | 1/1999 |
| WO | WO 99/36940 | 7/1999 |
| WO | WO 01/39555 A1 | 5/2001 |
| WO | WO 2006/116252 A2 | 11/2006 |

OTHER PUBLICATIONS

U.S. Appl. No. 08/619,380, filed Mar. 21, 1996.
U.S. Appl. No. 08/621,151, filed Mar. 21, 1996.
U.S. Appl. No. 08/878,694, filed Jun. 19, 1997.
U.S. Appl. No. 09/270,856, filed Mar. 17, 1999.
U.S. Appl. No. 09/504,640, filed Feb. 16, 2000.
U.S. Appl. No. 09/666,312, filed Sep. 21, 2000.
U.S. Appl. No. 12/191,799, filed Aug. 14, 2008.
U.S. Appl. No. 12/535,799, filed Aug. 5, 2009.
U.S. Appl. No. 12/606,672, filed Sep. 30, 2009.
U.S. Appl. No. 12/622,248, filed Nov. 19, 2009.
Hernandez et al., "A Controlled Study of the Argon Beam Coagultor for Partial Nephrectomy"; The Journal of Urology, vol. 143, May (J. Urol. 143: pp. 1062-1065, 1990).
Ward et al., "A Significant New Contribution to Radical Head and Neck Surgery"; Arch Otolaryngology, Head and Neck Surg., vol. 115 pp. 921-923 (Aug. 1989).
Brand et al., "Electrosurgical Debulking of Ovarian Cancer: A New Technique Using the Argon Beam Coagulator"; Gynecologic Oncology 39 pp. 115-118 (1990).
Grund et al., "Endoscopic Argon Plasma . . . Flexible Endoscopy"; Endoscopic Surgery and Allied Technologies, No. 1, vol. 2, pp. 42-46 (Feb. 1994).
Waye et al., "Endoscopic Treatment Options"; Techniques in Therapeutic Endoscopy, pp. 1.7-1.15, 1987.
B.D. Cullity, "Introduction to Magnetic Materials", University of Notre Dame; Addison-Wesley Publishing Company, Reading MA., (1972) pp. 23-28.
Yin et al., "Miniaturization of Inductively Coupled Plasma Sources", IEEE Transactions on Plasma Science, vol. 27, No. 5, Oct. 1999 pp. 1516-1524.
Farin et al., Technology of Argon Plasma . . . Endoscopic Applications; Endoscopic Surgery and Allied Technologies, No. 1, vol. 2, pp. 71-77 (Feb. 1994).

Mark H. Mellow, "The Role of Endoscopic Laser Therapy in Gastrointestinal Neoplasms"; Advanced Therapeutic Endoscopy, pp. 17-21, 1990.

Silverstein et al., "Thermal Coagulation Therapy for Upper Gatrointestinal Bleeding"; Advanced Therapeutic Endoscopy, pp. 79-84, 1990.

European Search Report EP 01 10 2843.8-2305, dated May 15, 2001.

European Search Report EP 05 00 2257, dated Jun. 1, 2005.

European Search Report EP 06 01 9572 dated Nov. 21, 2006.

European Search Report EP 07 00 4356 dated Jul. 2, 2007.

European Search Report EP 07 00 4659 dated Feb. 19, 2008.

European Search Report EP 07 00 4659—partial dated May 24, 2007.

International Search Report PCT/US98/19284, dated Jan. 14, 1999.

* cited by examiner

INDUCTIVELY-COUPLED PLASMA DEVICE

BACKGROUND

1. Technical Field

The present disclosure relates to plasma devices and processes for surface processing and material removal or deposition. More particularly, the disclosure relates to an apparatus and method for generating and directing plasma-generated species in a plasma device.

2. Background of Related Art

Electrical discharges in dense media, such as liquids and gases at or near atmospheric pressure, can, under appropriate conditions, result in plasma formation. Plasmas have the unique ability to create large amounts of chemical species, such as ions, radicals, electrons, excited-state (e.g., metastable) species, molecular fragments, photons, and the like. The plasma species may be generated in a variety of internal energy states or external kinetic energy distributions by tailoring plasma electron temperature and electron density. In addition, adjusting spatial, temporal and temperature properties of the plasma creates specific changes to the material being irradiated by the plasma species and associated photon fluxes. Plasmas are also capable of generating photons including energetic ultraviolet photons that have sufficient energy to initiate photochemical and photocatalytic reaction paths in biological and other materials that are irradiated by the plasma photons.

SUMMARY

Plasma has broad applicability to provide alternative solutions to industrial, scientific and medical needs, especially workpiece surface processing at low temperature. Plasmas may be delivered to a workpiece, thereby affecting multiple changes in the properties of materials upon which the plasmas impinge. Plasmas have the unique ability to create large fluxes of radiation (e.g., ultraviolet), ions, photons, electrons and other excited-state (e.g., metastable) species which are suitable for performing material property changes with high spatial, material selectivity, and temporal control. The plasma may remove a distinct upper layer of a workpiece but have little or no effect on a separate underlayer of the workpiece or it may be used to selectively remove a particular tissue from a mixed tissue region or selectively remove a tissue with minimal effect to adjacent organs of different tissue type.

According to one embodiment of the present disclosure a plasma device configured to receive ionizable media is disclosed. The plasma device includes a first pair of dielectric substrates each having an inner surface and an outer surface. The first pair of dielectric substrates is disposed in spaced, parallel relation relative to one another with the inner surfaces thereof facing one another. The device also includes a first pair of spiral coils each disposed on the inner surface of the dielectric substrates. The first pair of spiral coils is configured to couple to a power source and configured to inductively couple to an ionizable media passed therebetween to ignite the ionizable media to form a plasma effluent.

According to another embodiment of the present disclosure a plasma device configured to receive ionizable media is disclosed. The plasma device includes a first pair of dielectric substrates each having an inner surface and an outer surface. The first pair of dielectric substrates is disposed in spaced, parallel relation relative to one another with the inner surfaces thereof facing one another. The plasma device also includes a second pair of dielectric substrates coupled to the first pair of dielectric substrates and disposed transversely relative thereto, each of the second pair of dielectric substrates includes an inner surface and an outer surface. The second pair of dielectric substrates is also disposed in spaced, parallel relation relative to one another with the inner surfaces thereof facing one another. The plasma device further includes a first pair of spiral coils each disposed on the inner surface of the dielectric substrates and a second pair of spiral coils each disposed on the inner surface of the second dielectric substrates. The first and second pairs of spiral coils are configured to couple to the power source and configured to inductively couple to the ionizable media passed therebetween to ignite the ionizable media to form a plasma effluent.

According to a further embodiment of the present disclosure a plasma system is disclosed. The plasma system includes a plasma device having a first pair of dielectric substrates each having an inner surface and an outer surface. The first pair of dielectric substrates is disposed in spaced, parallel relation relative to one another with the inner surfaces thereof facing one another. The device also includes a first pair of spiral coils each disposed on the inner surface of the dielectric substrates. The system also includes an ionizable media source coupled to the plasma device and configured to supply ionizable media between the first pair of dielectric substrates and a power source coupled to the first pair of spiral coils. The first pair of spiral coils is configured to inductively couple to the ionizable media passed therebetween to ignite the ionizable media to form a plasma effluent.

BRIEF DESCRIPTION OF THE DRAWINGS

The accompanying drawings, which are incorporated in and constitute a part of this specification, illustrate exemplary embodiments of the disclosure and, together with a general description of the disclosure given above, and the detailed description of the embodiments given below, serve to explain the principles of the disclosure, wherein.

DETAILED DESCRIPTION

Plasmas are generated using electrical energy that is delivered as either direct current (DC) electricity or alternating current (AC) electricity at frequencies from about 0.1 hertz (Hz) to about 100 gigahertz (GHz), including radio frequency ("RF", from about 0.1 MHz to about 100 MHz) and microwave ("MW", from about 0.1 GHz to about 100 GHz) bands, using appropriate generators, electrodes, and antennas. Choice of excitation frequency, the workpiece, as well as the electrical circuit that is used to deliver electrical energy to the circuit affects many properties and requirements of the plasma. The performance of the plasma chemical generation, the delivery system and the design of the electrical excitation circuitry are interrelated, i.e., as the choices of operating voltage, frequency and current levels (as well as phase) effect the electron temperature and electron density. Further, choices of electrical excitation and plasma device hardware also determine how a given plasma system responds dynamically to the introduction of new ingredients to the host plasma gas or liquid media. The corresponding dynamic adjustment of the electrical drive, such as dynamic match networks or adjustments to voltage, current, or excitation frequency are required to maintain controlled power transfer from the electrical circuit to the plasma.

Figure 1:
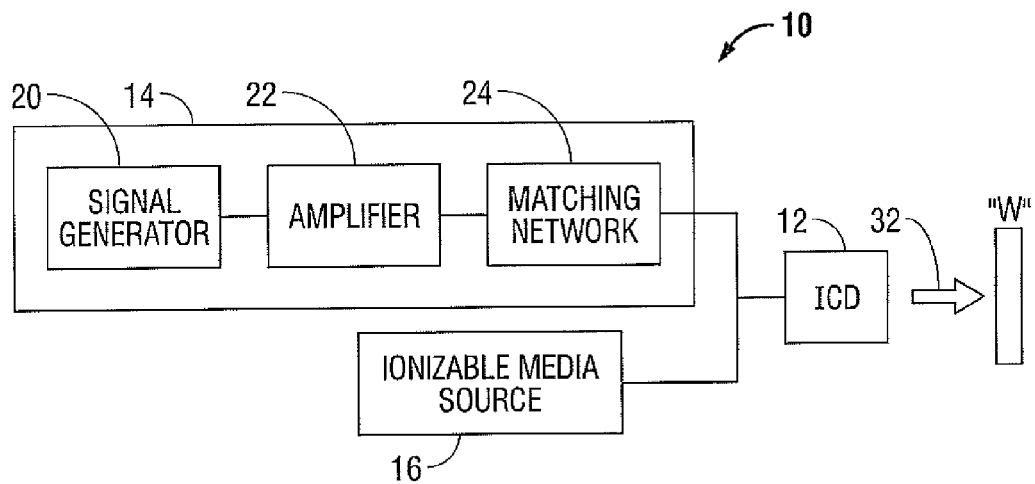
FIG. 1 is a schematic diagram of a plasma system according to the present disclosure.

Referring initially to FIG. 1, a plasma system 10 is disclosed. The system 10 includes an inductively-coupled device 12 that is coupled to a power source 14 and an ionizable media source 16. Power source 14 includes any required components for delivering power or matching impedance to plasma device 12. More particularly, the power source 14 may be any radio frequency generator or other suitable power source capable of producing power to ignite the ionizable media to generate plasma. The plasma device 12 may be utilized as an electrosurgical pencil for application of plasma to tissue and the power source 14 may be an electrosurgical generator that is adapted to supply the device 12 with electrical power at a frequency from about 0.1 MHz to about 1,000 MHz and, in another embodiment, from about 1 MHz to about 13.6 MHz. The plasma may also be ignited by using continuous or pulsed direct current (DC) electrical energy.

Power source 14 includes a signal generator 20 coupled to an amplifier 22. The signal generator 20 outputs a plurality of control signals to the amplifier 22 reflective of the desired waveform. The signal generator 20 allows for control of desired waveform parameters (e.g., frequency, duty cycle, amplitude, etc.). The amplifier 22 outputs the desired waveform at a frequency from about 0.1 MHz to about 1,000 MHz and in another illustrative embodiment from about 1 MHz to about 13.6 MHz. The power source 14 also includes a matching network 24 coupled to the amplifier 22. The matching network 24 may include one or more reactive and/or capacitive components that are configured to match the impedance of the load (e.g., plasma effluent) to the power source 14 by switching the components or by frequency tuning.

The system 10 provides a flow of plasma through the device 12 to a workpiece "W" (e.g., tissue). Plasma feedstocks, which include ionizable media 30 (FIG. 2), are supplied by the ionizable media source 16 to the plasma device 12. During operation, the ionizable media is provided to the plasma device 12 where the plasma feedstocks are ignited to form plasma effluent 32 containing ions, radicals, photons from the specific excited species and metastables that carry internal energy to drive desired chemical reactions in the workpiece "W" or at the surface thereof.

The ionizable media source 16 provides ionizable feedstock to the plasma device 12. The ionizable media source 16 may include a storage tank and a pump (not explicitly shown) that is coupled to the plasma device 12. The ionizable media may be a liquid or a gas such as argon, helium, neon, krypton, xenon, radon, carbon dioxide, nitrogen, hydrogen, oxygen, etc. and their mixtures, and the like, or a liquid. These and other gases may be initially in a liquid form that is gasified during application.

Figure 2:
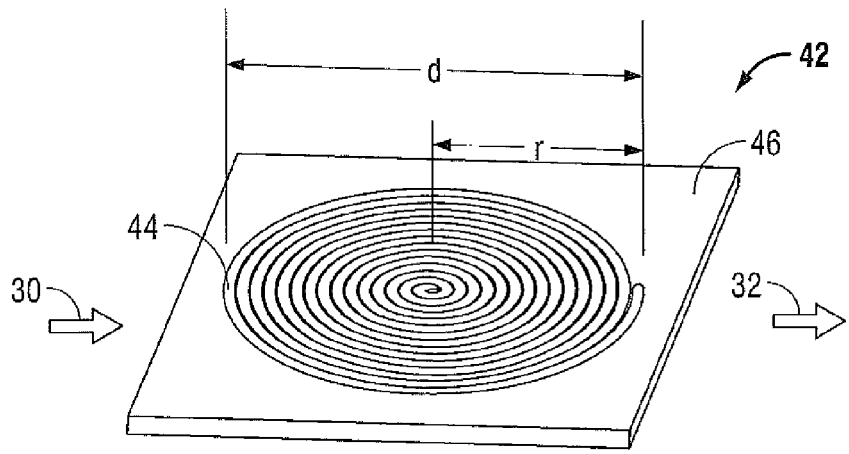
FIG. 2 is a perspective view of a plasma device according to the present disclosure.
Figure 3:
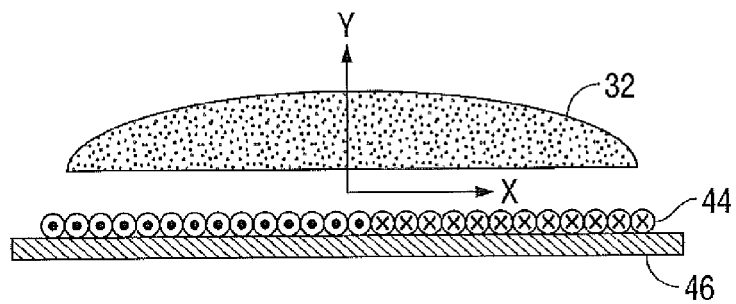
FIG. 3 is a side, cross-sectional view of the plasma device of FIG. 2 according to the present disclosure.

The device 12 is an inductively-coupled plasma device. In one embodiment as shown in FIGS. 2 and 3, an inductively-coupled plasma device 42 includes a spiral coil 44 disposed on a dielectric substrate 46. The coil 44 is coupled to the generator 14, which supplies current therethrough thereby generating a magnetic field above the coil 44. The ionizable media 30 is supplied across the coil 44 and is ignited as it passes through the magnetic field.

The coil 44 is of planar spiral coil design having a predetermined diameter "d" and a predetermined number of turns "n." The coil 44 may be formed from a copper wire of a suitable gauge. The coil 44 may be wound from the center or another location to create disk-like or ring-like structures, respectively. Alternatively, the coil 44 may be an etched copper coil on a printed circuit board.

Figure 4:
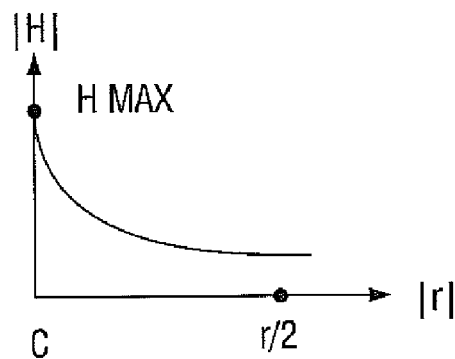
FIG. 4 is a plot of a vertical magnetic field intensity generated by the plasma device of FIG. 2.
Figure 5:
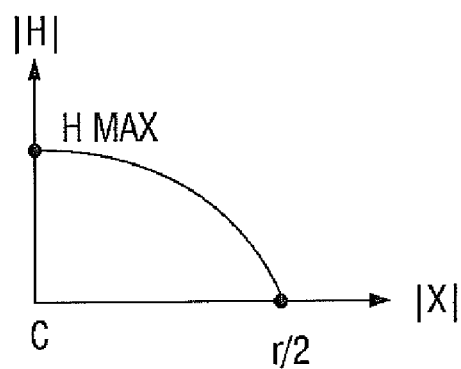
FIG. 5 is a plot of a horizontal magnetic field intensity generated by the plasma device of FIG. 2.

A single plane configuration (e.g., a single spiral coil 44) generates the plasma plume 30 having a diffuse half-plane field intensity that is proportional to the magnetic field intensity generated by the coil 44 as illustrated by magnetic field intensity plots of FIGS. 4 and 5. FIG. 4 illustrates a plot of the magnetic field intensity with respect to the vertical distance from center "c" of the coil 44. The field intensity decreases as a function of the distance from the coil. As a result, the plasma plume is thickest at the center of the single spiral coil and decreases toward the outer edge thereof. FIG. 5 illustrates a plot of the magnetic field intensity with respect to the horizontal distance "x" from the center "c" of the coil 44. Field intensity similarly decreases as a function of the distance from the center of the coil 44. This is due to poor coupling of the coil 44 with the plasma. In one embodiment, the coil 44 may be wound such that the outer rings thereof are spaced more densely than the inner rings. In another embodiment, a solenoid may be used in place of the spiral coil to improve the coupling efficiency, however, the structure of the solenoid prevents access to the inside thereof and to the plasma generated therein.

Figure 6:
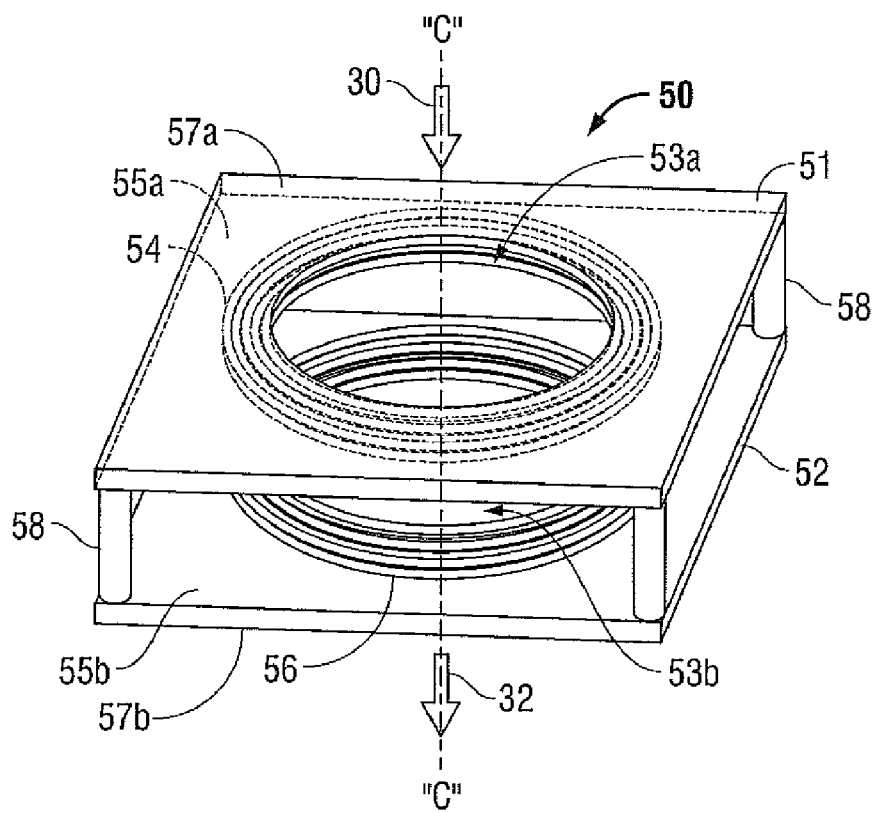
FIG. 6 is a perspective view of a plasma device according to the present disclosure.
Figure 7:
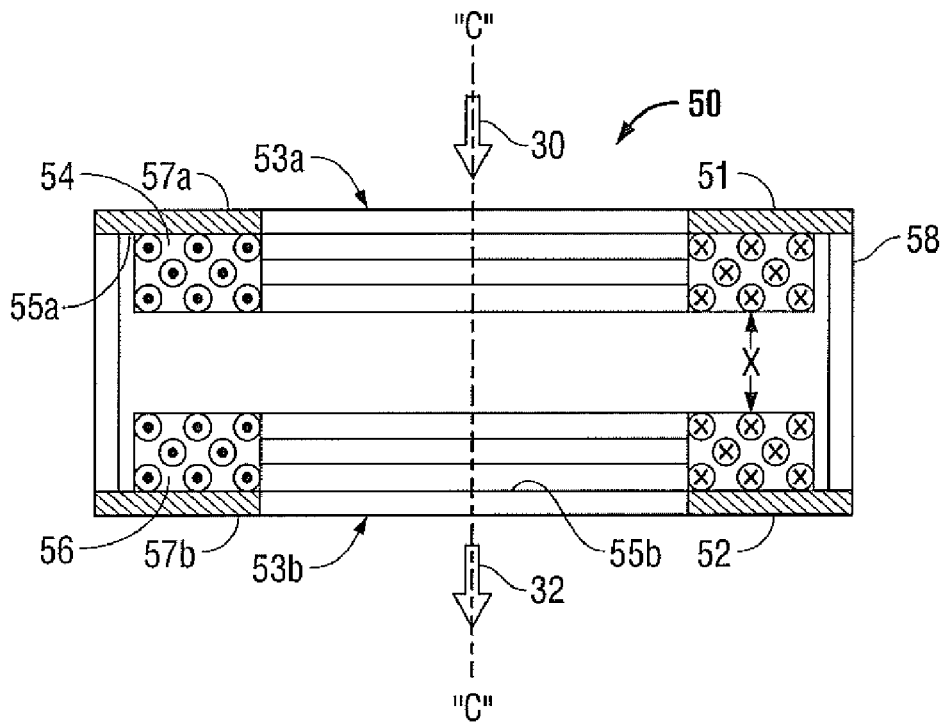
FIG. 7 is a side, cross-sectional view of the plasma device of FIG. 6 according to the present disclosure.

The present disclosure provides for another embodiment of an inductively-coupled plasma device 50 having two spiral coils 54 and 56 disposed in parallel at a predetermined distance "x" apart as shown in FIGS. 6 and 7. The plasma device 50 includes a first dielectric substrate 51 and a second dielectric substrate 52. The first and second dielectric substrates 51 and 52 include inner and outer surfaces 55a, 57a and 55b, 57b, respectively. The plasma device 50 also includes a first spiral coil 54 and a second spiral coil 56 disposed on the inner surfaces 55a, 55b of the first and second dielectric substrates 51 and 52, respectively. The coils 54 and 56 are of planar spiral coil design having a predetermined diameter "d" and a predetermined number of turns "n." The coils 54 and 56 may be formed from a copper wire of a suitable gauge or may be etched on a printed circuit board and suitably arranged in multiple layers. The coils 54 and 56 are wound either from the center or another location to create disk-like (FIGS. 9 and 10) or ring-like structures (FIGS. 6 and 7), respectively.

The dielectric substrates 51 and 52 may be formed from epoxy or any other type of thermosetting dielectric polymer to form a printed circuit board with the coils 54 and 56 being embedded therein (e.g., traced, etched, or printed). The dielectric substrates 51 and 52 are separated by two or more offsets 58 to secure the substrates 51 and 52, such that the spiral coils 54 and 56 are disposed in parallel relative to each other and are set a predetermined distance "x" apart. Each of the dielectric substrates 51 and 52 includes an opening 53a and 53b, respectively, defined therethrough.

Figure 8:
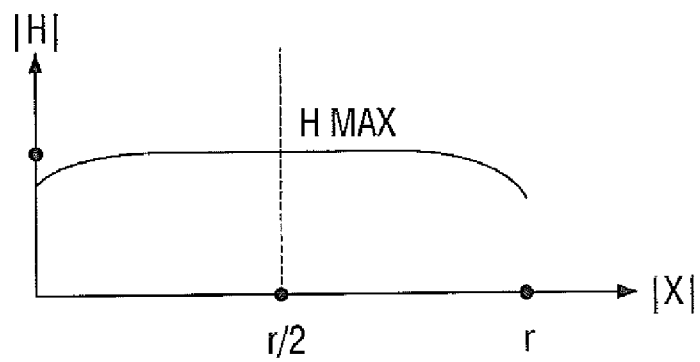
FIG. 8 is a plot of a horizontal magnetic field intensity generated by the plasma device of FIG. 6.

The plasma feedstocks are fed from one end of the device 50 through the opening 53a and are ignited as the coils 54 and 56 are energized to form a plasma effluent that is emitted from the opening 53b of the device 50 onto the workpiece "W." The field intensity stays relatively constant within the coils 54 and 56. FIG. 8 illustrates a plot of the magnetic field intensity with respect to the distance "x" along the center line "C" of the coils 54 and 56. The linearity and the intensity of magnetic field generated by the coils 54 and 55 do not drop off at the edges of the coils 54 and 55 as dramatically as the magnetic field intensity of the single coil 44 as illustrated in FIGS. 4 and 5. The magnetic field, H, may be expressed by a formula (1):

$$|H| = \frac{\pi \cdot n \cdot i}{5 \cdot r_c} \left[ \left\{ 1 + \frac{x^2}{r_c^2} \right\}^{-3/2} + \left\{ 1 + \left( \frac{r_c - x}{r_c} \right)^2 \right\}^{-3/2} \right] \quad (1)$$

In formula (1), $r_c$ is the radius of the coils 54 and 56, x is the distance between coils 54 and 56, and n is the number of turns and i is the coil current. Based on the formula (1), the intensity of the magnetic field, H, and the radius, rc, are inversely proportional. Thus, the intensity may be increased by decreasing the radius of the coils 54 and 56. At the center of the coils 54 and 56, the field is approximated by the formula (2):

$$|H| = \frac{\pi \cdot n \cdot i}{5 \cdot r_c} \quad (2)$$

Figure 9:
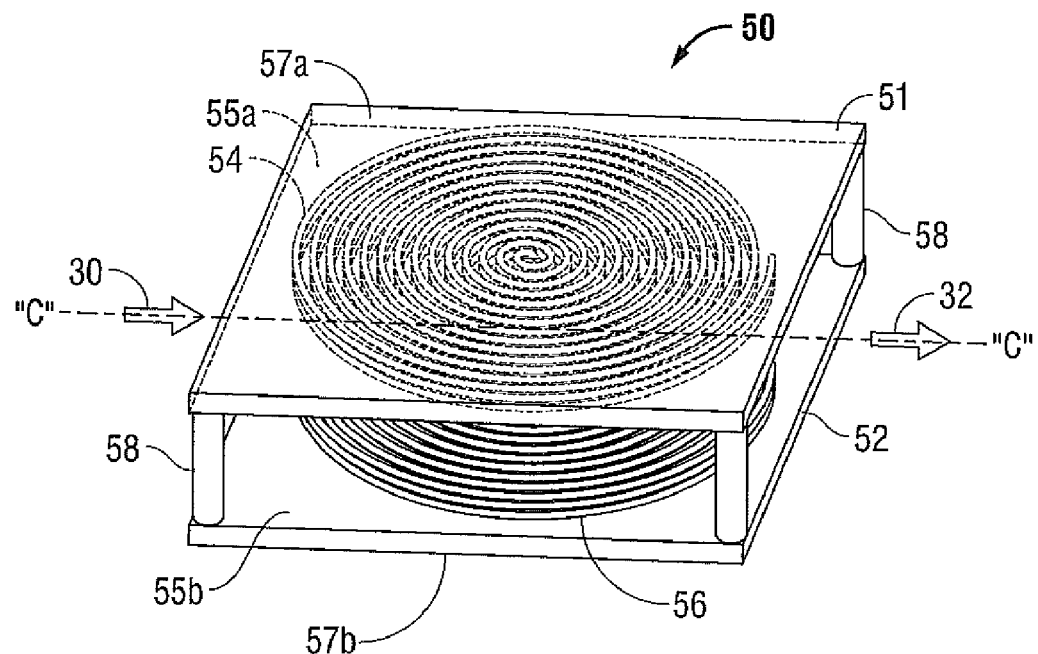
FIG. 9 is a perspective view of a plasma device according to the present disclosure.
Figure 10:
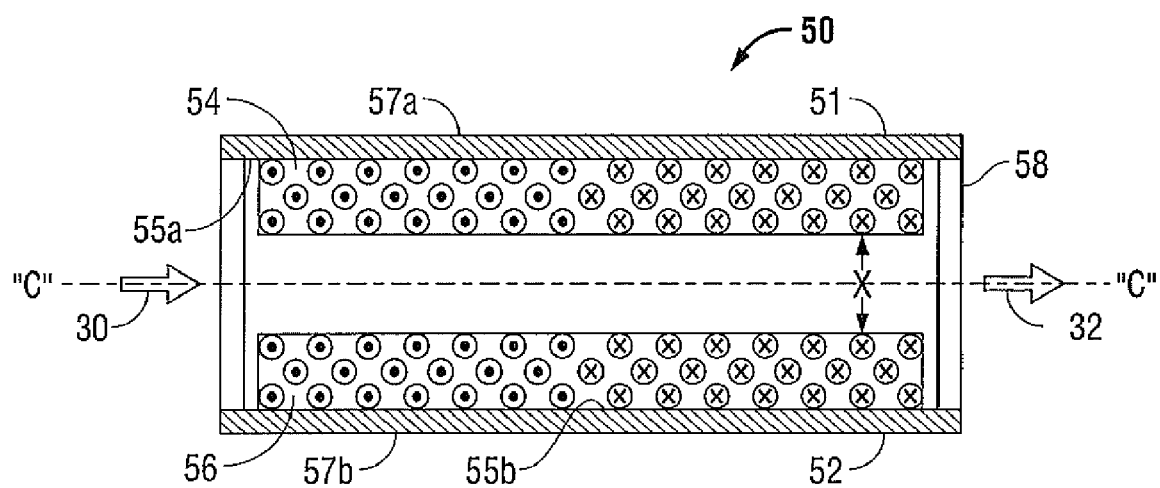
FIG. 10 is a side, cross-sectional view of the plasma device of FIG. 9 according to the present disclosure.

In another embodiment, as shown in FIGS. 9 and 10, each of the coils 54 and 56 may have a disk-like shape, in which instance the substrates 51 and 52 have a solid surface (e.g., no openings 53 and 53b) and the ionizable media is fed between and through the substrates 51 and 52.

Figure 11:
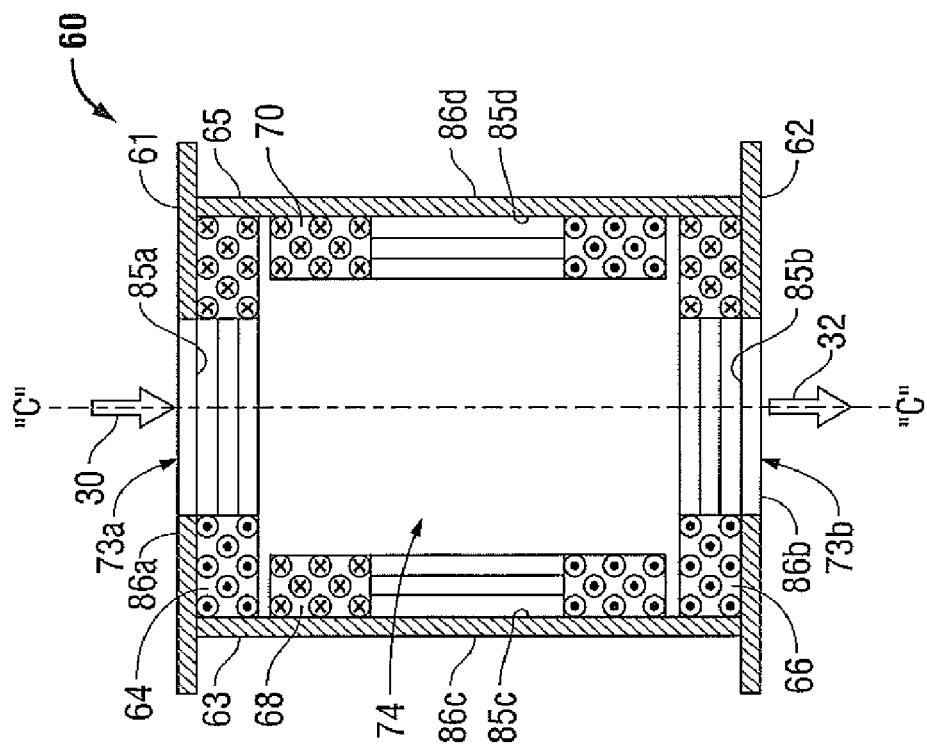
FIG. 11 is a perspective view of a plasma device according to the present disclosure.
Figure 12:
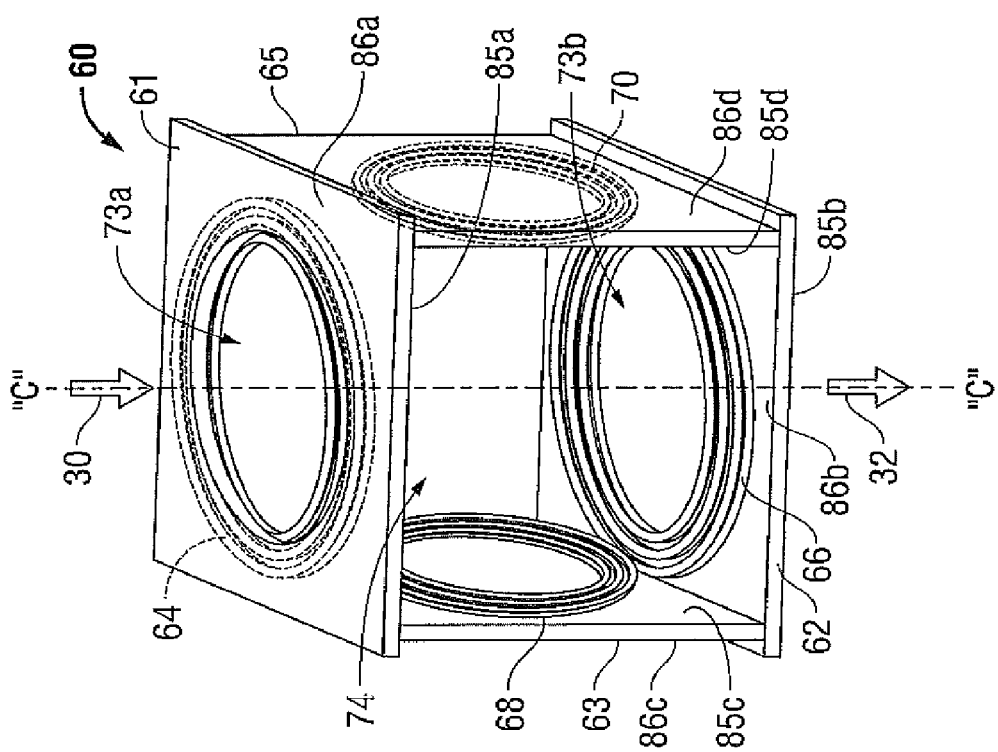
FIG. 12 is a side, cross-sectional view of the plasma device of FIG. 9 according to the present disclosure.

FIGS. 11 and 12 illustrate another embodiment of an inductively-coupled plasma device 60 having four spiral coils 64, 66, 68 and 70. The plasma device 60 includes a first dielectric substrate 61 and a second dielectric substrate 62. The first and second dielectric substrates 61 and 62 include inner and outer surfaces 85a, 86a and 85b, 86b, respectively. The plasma device also includes a first spiral coil 64 and a second spiral coil 66 disposed on the inner surfaces 85a, 86b of the first and second dielectric substrates 61 and 62, respectively.

The plasma device 60 also includes third and fourth dielectric substrates 63 and 65 disposed transversely between the substrates 61 and 62. The third and fourth dielectric substrates 63 and 65 include inner and outer surfaces 85c, 86c and 85d, 86d, respectively. The plasma device also includes a third spiral coil 68 and a fourth spiral coil 70 disposed on the inner surfaces 85c, 86d of the third and fourth dielectric substrates 63 and 65, respectively.

The coils 64, 66, 68 and 70 are of planar spiral coil design having a predetermined diameter "d" and a predetermined number of turns "n." The coils 64, 66, 68 and 70 may be formed from a copper wire of a suitable gauge or may be etched copper coils on a printed circuit board suitably arranged in multiple layers. The coils 64, 66, 68 and 70 may be wound from the center or another location to create disk-like (FIGS. 13 and 14) or ring-like structures (FIGS. 11 and 12), respectively.

The dielectric substrates 61, 62, 63, 65 may be formed from epoxy or any other type of thermosetting dielectric polymer to form a printed circuit board with the coils 64, 66, 68, 70 being embedded therein (e.g., traced). The dielectric substrates 61 and 62 are separated by two or more offsets (not shown) that secure the substrates 61 and 62, such that the spiral coils 64 and 66 are disposed in parallel and are set apart by the predetermined distance "x." The substrates 63 and 65 are also disposed in parallel with respect to each other. The substrates 63 and 65 are transversely secured within the substrates 61 and 62. The configuration of the substrates 61, 62, 63, 65 arranges the coils 64, 66, 68, 70 in a four-walled chamber 74. Each of the dielectric substrates 61 and 62 includes an opening 73a and 73b, respectively, defined therethrough.

The ionizable media 30 is fed from the opening 73a end of the device 60 and is ignited as the coils 64, 66, 68, 70 are energized to form the plasma effluent 32 (e.g., point-source or ball plasma), which is emitted from the opening 73b of the device 60 onto the workpiece "W." The field intensity stays relatively constant within the coils 64 and 66 and the surface of the coils 68 and 70. Transverse arrangement of the coils 64, 66 and 68, 70 allows for three-dimensional control of the plasma effluent 32.

Figure 14:
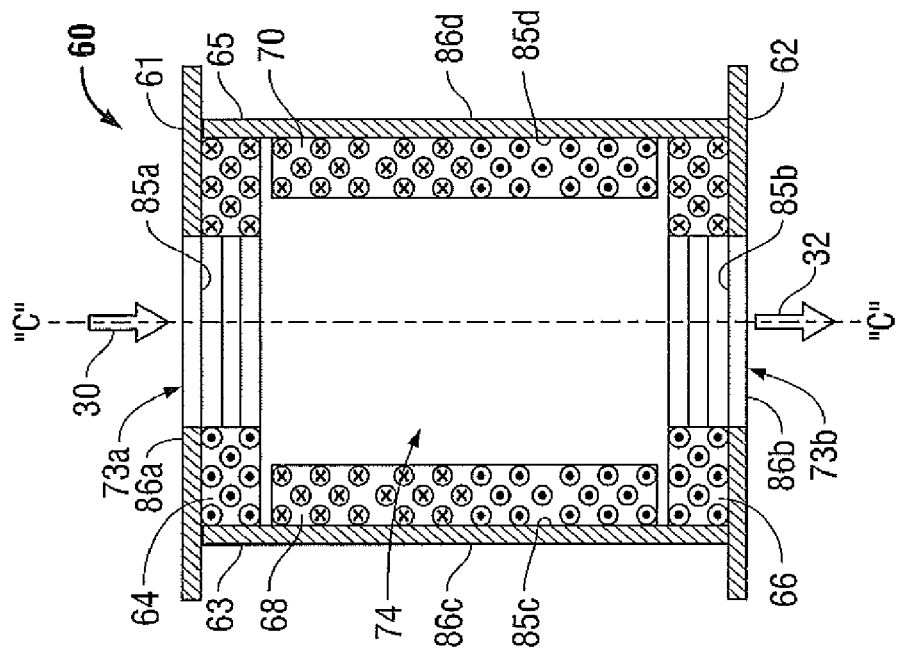
FIG. 14 is a side, cross-sectional view of the plasma device of FIG. 9 according to the present disclosure.
Figure 13:
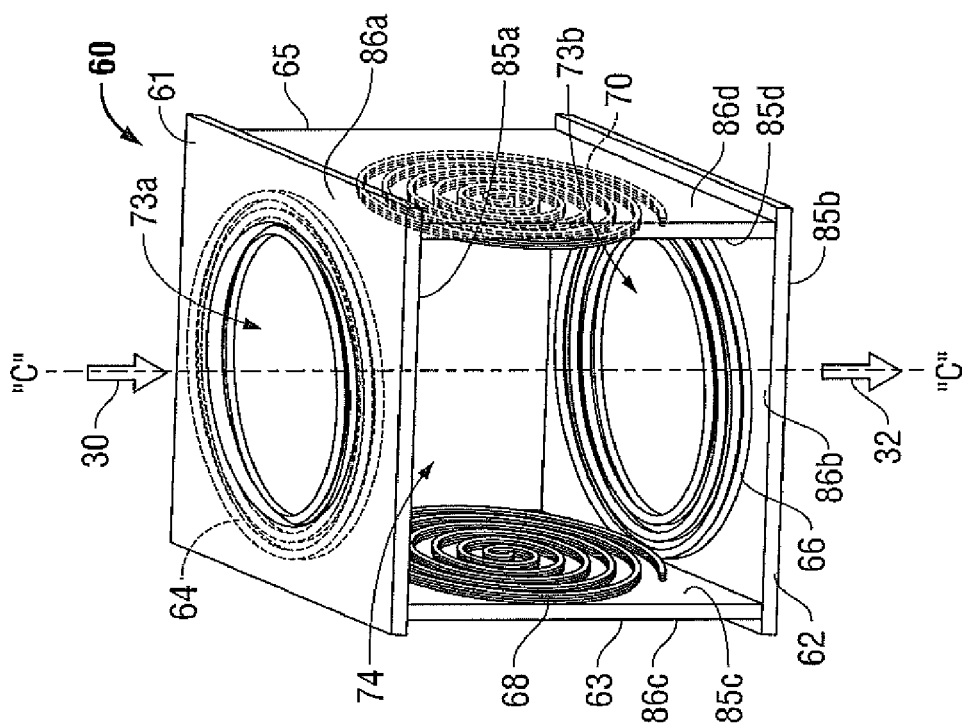
FIG. 13 is a perspective view of a plasma device according to the present disclosure.

In another embodiment, as shown in FIGS. 13 and 14, each of the coils 68 and 70 may have a disk-like shape, and the ionizable media is fed between and through the openings 73a and 73b as shown in FIGS. 13 and 14.

Although the illustrative embodiments of the present disclosure have been described herein with reference to the accompanying drawings, it is to be understood that the disclosure is not limited to those precise embodiments, and that various other changes and modifications may be effected therein by one skilled in the art without departing from the scope or spirit of the disclosure.

What is claimed is:

1. A plasma device configured to receive ionizable media, comprising:
    a first pair of dielectric substrates each having an inner surface and an outer surface, the first pair of dielectric substrates disposed in spaced, parallel relation relative to one another with the inner surfaces thereof facing one another; and
    a first pair of spiral coils each disposed on the inner surface of the dielectric substrates, wherein the first pair of spiral coils is configured to couple to a power source and configured to inductively couple to an ionizable media passed therebetween to ignite the ionizable media to form a plasma effluent.

2. The plasma device according to claim 1, further comprising:
    a plurality of offsets disposed between the first pair of dielectric substrates.

3. The plasma device according to claim 1, wherein each of the spiral coils of the first pair of spiral coils is formed from a wire to form a disk-like structure.

4. The plasma device according to claim 1, wherein each of the spiral coils of the first pair of spiral coils formed from a wire to form a ring-like structure.

5. The plasma device according to claim 1, wherein each of the dielectric substrates of the first pair of dielectric substrates is formed from a thermosetting dielectric polymer.

6. The plasma device according to claim 1, wherein each of the spiral coils of the first pair of spiral coils is traced on the corresponding dielectric substrate.

7. The plasma device according to claim 1, further comprising:
    a second pair of dielectric substrates coupled to the first pair of dielectric substrates and disposed transversely relative thereto, each of the second pair of dielectric substrates includes an inner surface and an outer surface, the second pair of dielectric substrates disposed in spaced, parallel relation relative to one another with the inner surfaces thereof facing one another; and a second pair of spiral coils each disposed on the inner surface of the second dielectric substrates, wherein the second pair of spiral coils is configured to couple to the power source and configured to inductively couple to the ionizable media passed therebetween to ignite the ionizable media to form a plasma effluent.

8. A plasma device configured to receive ionizable media, comprising:

a first pair of dielectric substrates each having an inner surface and an outer surface, the first pair of dielectric substrates disposed in spaced, parallel relation relative to one another with the inner surfaces thereof facing one another;

a second pair of dielectric substrates coupled to the first pair of dielectric substrates and disposed transversely relative thereto, each of the second pair of dielectric substrates includes an inner surface and an outer surface, the second pair of dielectric substrates disposed in spaced, parallel relation relative to one another with the inner surfaces thereof facing one another;

a first pair of spiral coils each disposed on the inner surface of the dielectric substrates; and a second pair of spiral coils each disposed on the inner surface of the second dielectric substrates, wherein the first and second pairs of spiral coils are configured to couple to the power source and configured to inductively couple to the ionizable media passed therebetween to ignite the ionizable media to form a plasma effluent.

9. The plasma device according to claim 8, further comprising:

a plurality of offsets disposed between the first pair of dielectric substrates.

10. The plasma device according to claim 8, wherein each of spiral coils of the first and second pairs of spiral coils is formed from a wire to form a disk-like structure.

11. The plasma device according to claim 8, wherein each of the spiral coils of the first and second pairs of spiral coils is formed from a wire to form a ring-like structure.

12. The plasma device according to claim 8, wherein each of the dielectric substrates of the first and second pairs of dielectric substrates is formed from a thermosetting dielectric polymer.

13. The plasma device according to claim 8, wherein each of the spiral coils of the first and second pairs of spiral coils is traced on the corresponding dielectric substrate.

14. A plasma system, comprising:

a plasma device including:

a first pair of dielectric substrates each having an inner surface and an outer surface, the first pair of dielectric substrates disposed in spaced, parallel relation relative to one another with the inner surfaces thereof facing one another;

a first pair of spiral coils each disposed on the inner surface of the dielectric substrates;

an ionizable media source coupled to the plasma device and configured to supply ionizable media between the first pair of dielectric substrates; and a power source coupled to the first pair of spiral coils, wherein the first pair of spiral coils is configured to inductively couple to the ionizable media passed therebetween to ignite the ionizable media to form a plasma effluent.

15. The plasma system according to claim 14, further comprising:

a plurality of offsets disposed between the first pair of dielectric substrates.

16. The plasma system according to claim 14, wherein each of the spiral coils of the first pair of spiral coils is formed from a wire to form a disk-like structure.

17. The plasma system according to claim 14, wherein each of the spiral coils of the first pair of spiral coils is formed from a wire to form a ring-like structure.

18. The plasma system according to claim 14, wherein each of the dielectric substrates of the first pair of dielectric substrates is formed from a thermosetting dielectric polymer.

19. The plasma system according to claim 14, wherein each of the spiral coils of the first pair of spiral coils is traced on the corresponding dielectric substrate.

20. The plasma system according to claim 14, wherein the plasma device further includes:

a second pair of dielectric substrates coupled to the first pair of dielectric substrates and disposed transversely relative thereto, each of the second pair of dielectric substrates includes an inner surface and an outer surface, the second pair of dielectric substrates disposed in spaced, parallel relation relative to one another with the inner surfaces thereof facing one another; and a second pair of spiral coils each disposed on the inner surface of the second dielectric substrates, wherein the power source is coupled to the second pair of spiral coils that are configured to inductively couple to the ionizable media passed therebetween to ignite the ionizable media to form a plasma effluent.

* * * * *